(12) United States Patent
Hsueh

(10) Patent No.: US 11,955,446 B2
(45) Date of Patent: Apr. 9, 2024

(54) METHOD FOR FORMING SEMICONDUCTOR DEVICE STRUCTURE WITH CONDUCTIVE POLYMER LINER

(71) Applicant: NANYA TECHNOLOGY CORPORATION, New Taipei (TW)

(72) Inventor: Yu-Han Hsueh, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/993,235

(22) Filed: Nov. 23, 2022

(65) Prior Publication Data

US 2023/0078105 A1    Mar. 16, 2023

Related U.S. Application Data

(62) Division of application No. 17/004,889, filed on Aug. 27, 2020, now Pat. No. 11,569,189.

(51) Int. Cl.
*H01L 23/48* (2006.01)
*H01L 23/00* (2006.01)

(52) U.S. Cl.
CPC .............. *H01L 24/08* (2013.01); *H01L 24/03* (2013.01); *H01L 24/05* (2013.01); *H01L 24/09* (2013.01); *H01L 24/80* (2013.01); *H01L 2224/03011* (2013.01); *H01L 2224/05547* (2013.01); *H01L 2224/05624* (2013.01); *H01L 2224/05647* (2013.01); *H01L 2224/05666* (2013.01); *H01L 2224/05681* (2013.01); *H01L 2224/05684* (2013.01); *H01L 2224/0569* (2013.01); *H01L 2224/05693* (2013.01); *H01L 2224/08145* (2013.01); *H01L 2224/09505* (2013.01); *H01L 2224/80948* (2013.01)

(58) Field of Classification Search
CPC . H01L 2224/08145; H01L 2224/09505; H01L 24/80; H01L 24/03-09; H01L 2224/03011–05666

See application file for complete search history.

(56) References Cited

U.S. PATENT DOCUMENTS

2016/0190103 A1*  6/2016  Kabe ..................... H01L 23/564
                                                      257/777
2017/0303401 A1* 10/2017  Rathburn ............. H05K 3/4007

* cited by examiner

*Primary Examiner* — Hoa B Trinh
(74) *Attorney, Agent, or Firm* — Xuan Zhang

(57) ABSTRACT

The present disclosure relates to a method for forming a semiconductor device structure. The method includes forming a first semiconductor die and forming a second semiconductor die. The first semiconductor die includes a first metal layer, a first conductive via over the first metal layer, and a first conductive polymer liner surrounding the first conductive via. The second semiconductor die includes a second metal layer, a second conductive via over the second metal layer, and a second conductive polymer liner surrounding the second conductive via. The method also includes forming a conductive structure electrically connecting the first metal layer and the second metal layer by bonding the second semiconductor die to the first semiconductor die. The conductive structure is formed by the first conductive via, the first conductive polymer liner, the second conductive via, and the second conductive polymer liner.

6 Claims, 20 Drawing Sheets

METHOD FOR FORMING SEMICONDUCTOR DEVICE STRUCTURE WITH CONDUCTIVE POLYMER LINER

CROSS-REFERENCE TO RELATED APPLICATION

This application is a divisional application of U.S. Non-Provisional application Ser. No. 17/004,889 filed 27 Aug. 2020, which is incorporated herein by reference in its entirety.

TECHNICAL FIELD

The present disclosure relates to a method for forming a semiconductor device structure, and more particularly, to a method for forming a semiconductor device structure with a conductive polymer liner.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

In a semiconductor device, an interconnecting structure is used to electrically connect conductive elements in different layers or in the same layer of an integrated circuit. However, as the semiconductor device scaling-down continues, an interval between adjacent conductive elements is increasingly shrunk, which may decrease the process window of the interconnecting structure. Therefore, it is more and more difficult to manufacture the interconnecting structure in the semiconductor device.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first metal layer disposed over a semiconductor substrate, and a second metal layer disposed over the first metal layer. The semiconductor device structure also includes a conductive structure disposed between the first metal layer and the second metal layer. The conductive structure includes a first conductive via and a first conductive polymer liner surrounding the first conductive via.

In an embodiment, the first conductive polymer liner comprises graphene or conjugated polymer. In an embodiment, the first conductive via and the first conductive polymer liner are in direct contact with a top surface of the first metal layer. In an embodiment, the semiconductor device structure further includes a first dielectric layer disposed between the first metal layer and the second metal layer, wherein the first conductive polymer liner is surrounded by the first dielectric layer, and the first dielectric layer is in direct contact with a top surface of the first metal layer. In an embodiment, the conductive structure further includes a second conductive via and a second conductive polymer liner surrounding the second conductive via, wherein the second conductive via is bonded on the first conductive via, and the second conductive polymer liner is bonded on the first conductive polymer liner, and wherein the second conductive polymer liner includes graphene or conjugated polymer.

In an embodiment, the second conductive via and the second conductive polymer liner are in direct contact with a bottom surface of the second metal layer, and wherein the second device structure further includes a second dielectric layer disposed between the first metal layer and the second metal layer, wherein the second conductive polymer liner is surrounded by the second dielectric layer, and the second dielectric layer is in direct contact with the bottom surface of the second metal layer. In an embodiment, the semiconductor device structure further includes an energy removable structure disposed between the first metal layer and the second metal layer and separated from the conductive structure, wherein an air gap structure is enclosed by the energy removable structure.

In another embodiment of the present disclosure, a semiconductor device structure is provided. The semiconductor device structure includes a first metal layer disposed over a semiconductor substrate, and a conductive structure disposed over the first metal layer. The conductive structure includes a first conductive via, a second conductive via disposed over the first conductive via, a first conductive polymer liner disposed on sidewalls of the first conductive via, and a second conductive polymer liner disposed on sidewalls of the second conductive via. The first conductive polymer liner and the second conductive polymer liner include graphene or conjugated polymer. The semiconductor device structure also includes a second metal layer disposed over the conductive structure.

In an embodiment, the first conductive polymer liner and the second conductive polymer liner comprise poly(3,4-ethylenedioxythiophene) (PEDOT) or polyaniline (PANT). In an embodiment, the sidewalls of the first conductive via are substantially aligned with the sidewalls of the second conductive via. In an embodiment, the semiconductor device structure further includes a first dielectric layer and a second dielectric layer disposed between the first metal layer and the second metal layer, wherein the first conductive polymer liner is surrounded by the first dielectric layer, and the second conductive polymer liner is surrounded by the second dielectric layer.

In an embodiment, the semiconductor device structure further includes an energy removable structure penetrating through the first dielectric layer and the second dielectric layer to contact the first metal layer and the second metal layer, wherein the energy removable structure is separated from the conductive structure. In an embodiment, an air gap structure is separated from the first metal layer and the second metal layer by the energy removable structure.

In yet another embodiment of the present disclosure, a method for forming a semiconductor device structure is provided. The method includes forming a first semiconductor die and forming a second semiconductor die. The first semiconductor die includes a first metal layer, a first conductive via over the first metal layer, and a first conductive polymer liner surrounding the first conductive via. The second semiconductor die includes a second metal layer, a second conductive via over the second metal layer, and a second conductive polymer liner surrounding the second conductive via. The method also includes forming a conductive structure electrically connecting the first metal layer and the second metal layer by bonding the second semiconductor die to the first semiconductor die. The conductive structure is formed by the first conductive via, the first conductive polymer liner, the second conductive via, and the second conductive polymer liner. The first conductive via is bonded with the second conductive via, and the first conductive polymer liner is bonded with the second conductive polymer liner.

In an embodiment, the forming of the first semiconductor die includes forming the first metal layer over a first semiconductor substrate, and forming a first dielectric layer covering the first metal layer. The forming of the first semiconductor die also includes etching the first dielectric layer to form a first opening exposing a portion of the first metal layer, and forming the first conductive via and the first conductive polymer liner in the first opening to contact the portion of the first metal layer. In an embodiment, the forming of the first conductive polymer liner includes depositing a first conductive polymer material over a bottom surface and sidewalls of the first opening, and removing a portion of the first conductive polymer material over the bottom surface of the first opening, wherein a remaining portion of the first conductive polymer material forms the first conductive polymer liner. In an embodiment, the first conductive polymer material comprises graphene, poly(3,4-ethylenedioxythiophene) (PEDOT), or polyaniline (PANT).

In an embodiment, the forming of the first semiconductor die further includes etching the first dielectric layer to form a second opening exposing another portion of the first metal layer after the first conductive via is formed, and filling the second opening with a first energy removable material. In an embodiment, the second semiconductor die further includes a second energy removable material, and the second energy removable material is bonded with the first energy removable material after the second semiconductor die is bonded to the first semiconductor die. In an embodiment, the method further includes performing a heat treatment process to transform the first energy removable material and the second energy removable material into an energy removable structure after the conductive structure is formed, wherein an air gap structure is enclosed by the energy removable structure, and the conductive structure is surrounded by the air gap structure.

Embodiments of a semiconductor device structure are provided in the disclosure. In some embodiments, the semiconductor device structure includes a conductive polymer liner surrounding a conductive via, and the conductive via is used as an interconnecting structure. For example, the conductive via is disposed over a first metal layer, and the conductive via is used to electrically connect the first metal layer to a second metal layer formed over the conductive via. The conductive polymer liner is configured to lower the resistance of the semiconductor device structure. Therefore, the operation speed of the semiconductor device structure may be increased, which significantly improves the overall device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
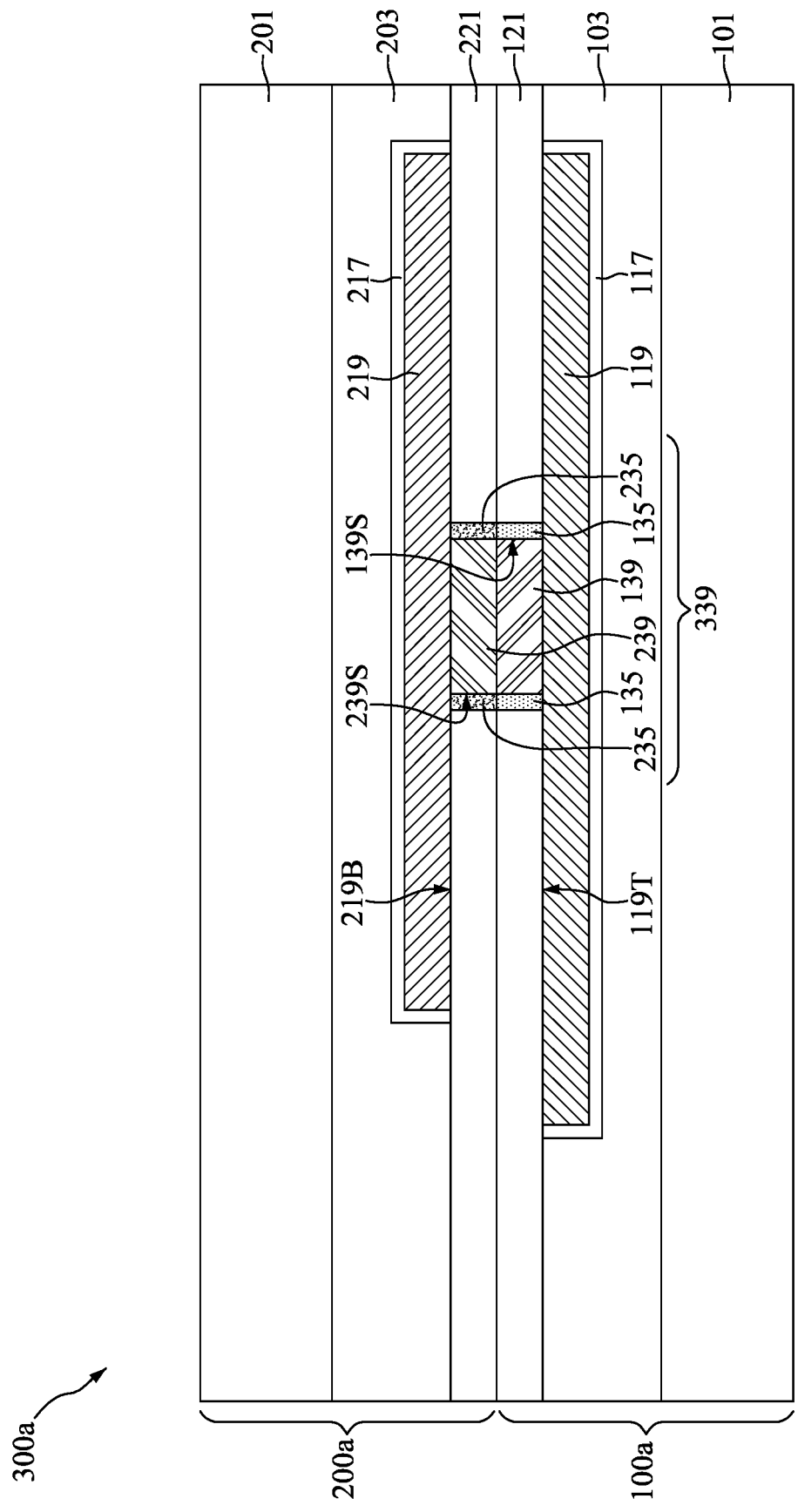
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 300a, in accordance with some embodiments. The semiconductor device structure 300a includes a first semiconductor die 100a and a second semiconductor die 200a bonded on the first semiconductor die 100a, as shown in FIG. 1 in accordance with some embodiments.

In the first semiconductor die 100a, a dielectric layer 103 is disposed over a first semiconductor substrate 101, and a first metal layer 119 is disposed in the dielectric layer 103. In some embodiments, the first metal layer 119 is separated from the dielectric layer 103 by a barrier layer 117. Moreover, a dielectric layer 121 is disposed over the dielectric layer 103, the barrier layer 117 and the first metal layer 119. In some embodiments, a first conductive via 139 is disposed in the dielectric layer 103, and the first conductive via 139 is separated from the dielectric layer by a first conductive polymer liner 135.

In some embodiments, the first conductive via 139 is surrounded by the first conductive polymer liner 135, and the first conductive polymer liner 135 is surrounded by the dielectric layer 121. Specifically, the first conductive polymer liner 135 is disposed on sidewalls 139S of the first conductive via 139. In some embodiments, the first conductive via 139 and the first conductive polymer liner 135 are in direct contact with a top surface 119T of the first metal layer 119.

In the second semiconductor die 200a, a second conductive via 239 is bonded to the first conductive via 139 of the first semiconductor die 100a, and a second conductive polymer liner 235 is bonded to the first conductive polymer liner 135 of the first semiconductor die 100a. In some embodiments, the second conductive via 239 is surrounded by the second conductive polymer liner 235, and the second conductive polymer liner 235 is surrounded by a dielectric layer 221, which is bonded to the dielectric layer 121 of the first semiconductor die 100a. Specifically, the second conductive polymer liner 235 is disposed on sidewalls 239S of the second conductive via 239.

The second semiconductor die 200a also includes a second metal layer 219 disposed over the dielectric layer 221, the second conductive via 239 and the second conductive polymer liner 235. In some embodiments, the second conductive via 239 and the second conductive polymer liner 235 are in direct contact with a bottom surface 219B of the second metal layer 219. Moreover, the second metal layer 219 is disposed in a dielectric layer 203, and a second semiconductor substrate 201 is disposed over the dielectric layer 203. In some embodiments, the second metal layer 219 is separated from the dielectric layer 203 by a barrier layer 217.

It should be noted that, the first conductive via 139 and the first conductive polymer liner 135 of the first semiconductor die 100a, and the second conductive via 239 and the second conductive polymer liner 235 of the second semiconductor die 200a form a conductive structure 339. In some embodiments, the conductive structure 339 electrically connects the first metal layer 119 of the first semiconductor die 100a and the second metal layer 219 of the second semiconductor die 200a. The conductive structure 339 will be described in more detail later.

Figure 2:
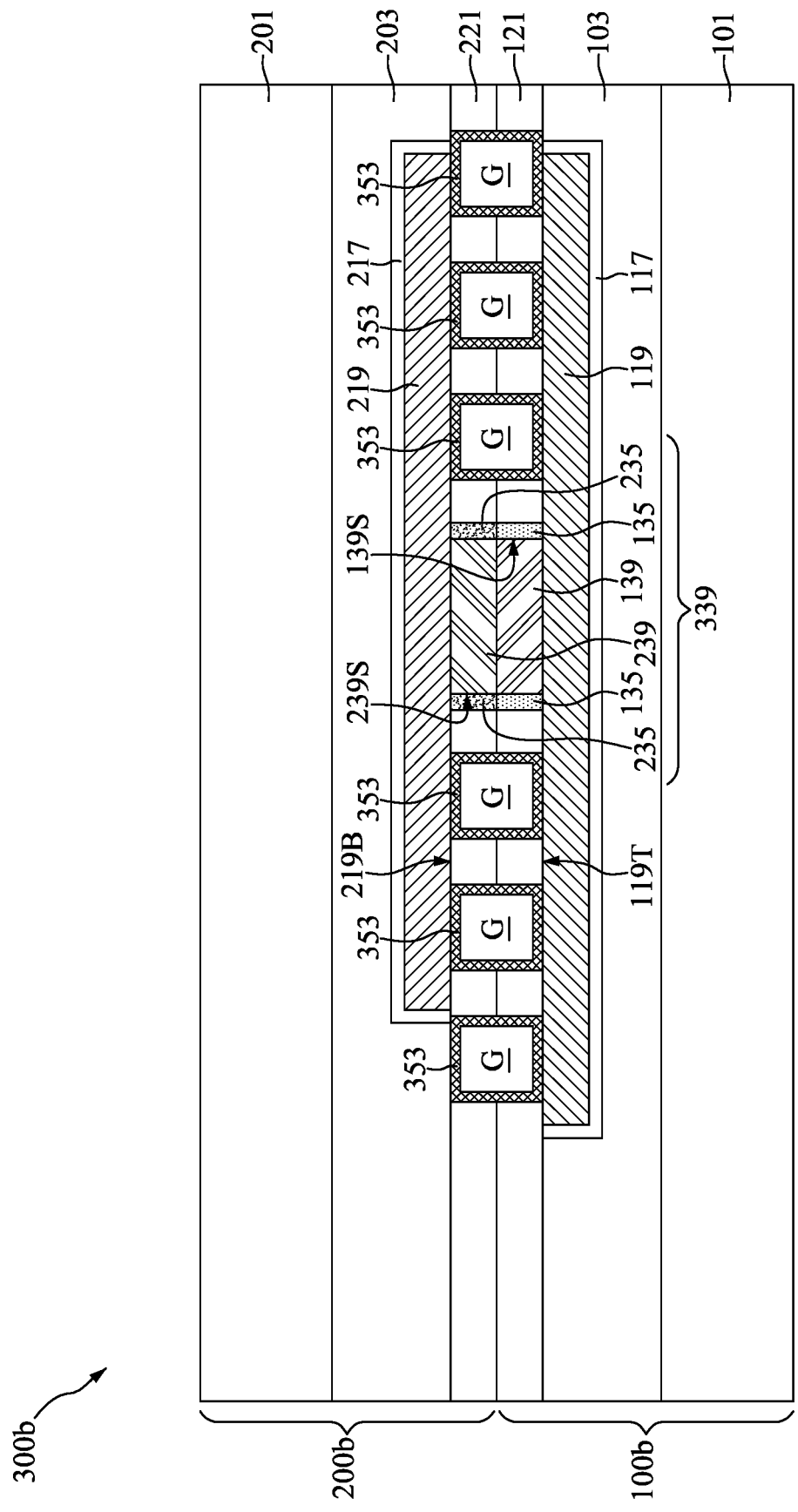
FIG. 2 is a cross-sectional view illustrating a modified semiconductor device structure, in accordance with some embodiments.

FIG. 2 is a cross-sectional view illustrating a modified semiconductor device structure 300b, which is an alternative embodiment of the semiconductor device structure 300a, in accordance with some embodiments. For reasons of consistency and clarity, similar components appearing in both FIGS. 1 and 2 will be labeled the same.

Similar to the semiconductor device structure 300a, the modified semiconductor device structure 300b includes a modified first semiconductor die 100b and a modified second semiconductor die 200b bonded on the modified first semiconductor die 100b. A difference is that the modified semiconductor device structure 300b includes an energy removable structure 353 and an air gap structure G enclosed in the energy removable structure 353.

Although six portions of the energy removable structure 353 are shown in the cross-sectional view of FIG. 2, the six portions of the energy removable structure 353 may be connected to each other in different cross-sectional views. Similar to the energy removable structure 353, the six portions of the air gap structure G may also be connected to each other in different cross-sectional views. Furthermore, the numbers of the portions of the energy removable structure 353 and the air gap structure 353 may be adjusted depending on design requirements of the modified semiconductor device structure 300b.

In some embodiments, the energy removable structure 353 and the air gap structure G are disposed between the first metal layer 119 and the second metal layer 219. Moreover, the lower portion of the energy removable structure 353 is disposed in the dielectric layer 121 of the modified first semiconductor die 100b, and the upper portion of the energy removable structure 353 is disposed in the dielectric layer 221 of the modified second semiconductor die 200b. In some embodiments, the energy removable structure 353 is in direct contact with the top surface 119T of the first metal layer 119 and the bottom surface 219B of the second metal layer 219. In other words, the air gap structure G is separated from the first metal layer 119 and the second metal layer 219 by the energy removable structure 353.

As mentioned above, in some embodiments, the six portions of the air gap structure G are connected to each other. Thus, the conductive structure 339 is surrounded by the air gap structure G. In addition, the conductive structure 339 is separated from the energy removable structure 353, in accordance with some embodiments. The energy removable structure 353 will be described in more detail later.

Figure 3:
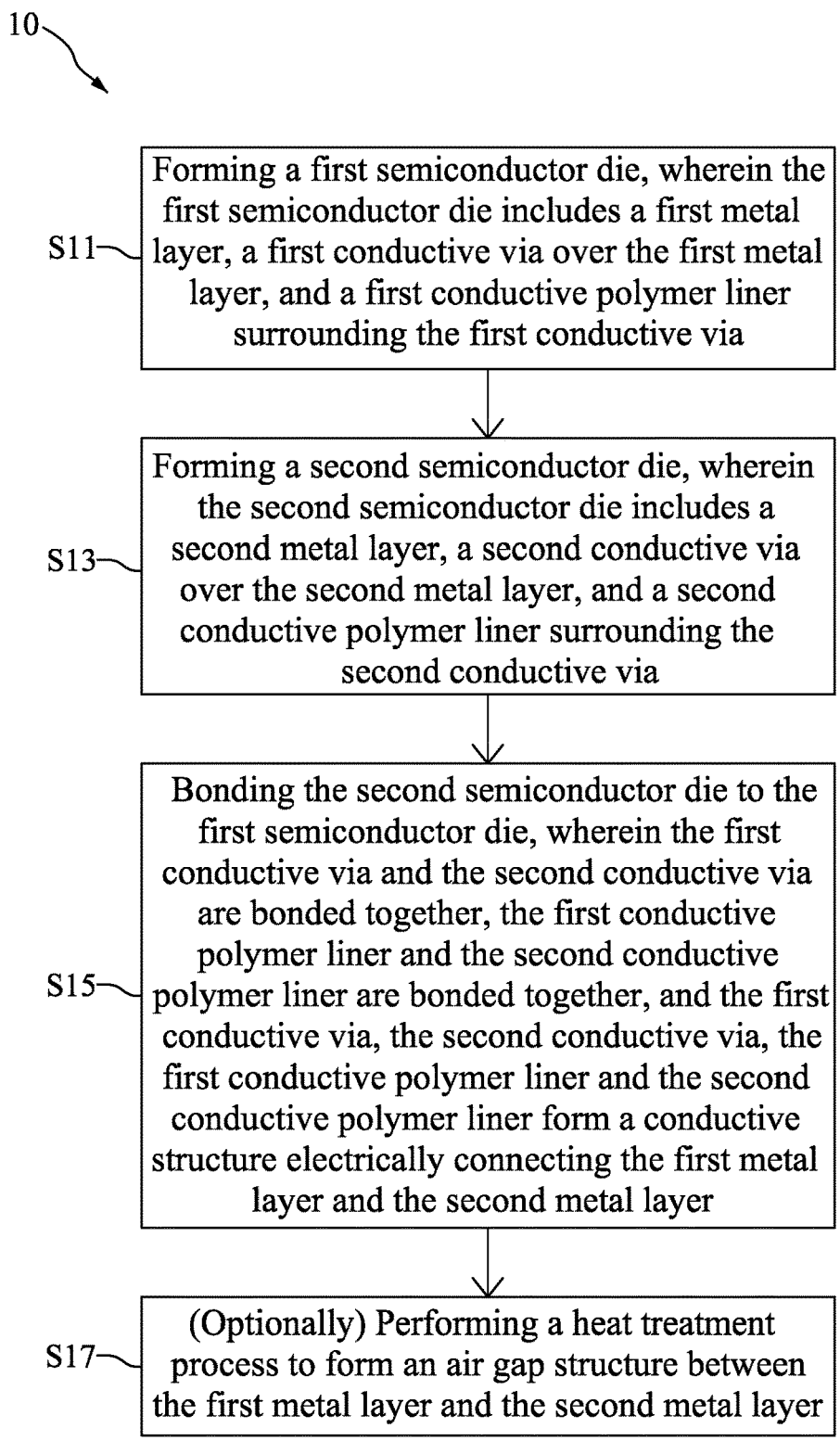
FIG. 3 is a flow diagram illustrating a method for forming a semiconductor device structure, in accordance with some embodiments.

FIG. 3 is a flow diagram illustrating a method 10 for forming the semiconductor device structure 300a, and the method 10 includes steps S11, S13, S15 and S17, in accordance with some embodiments. The steps S11 to S17 are elaborated in connection with the following figures.

FIGS. 4 to 15 are cross-sectional views illustrating intermediate stages of forming the semiconductor device structure 300a, in accordance with some embodiments. Specifically, FIGS. 4 to 15 show cross-sectional views of a sequential process flow of preparing the first semiconductor die 100a, in accordance with some embodiments. The respective step is illustrated as the step S11 in the method 10 shown in FIG. 3.

Figure 4:
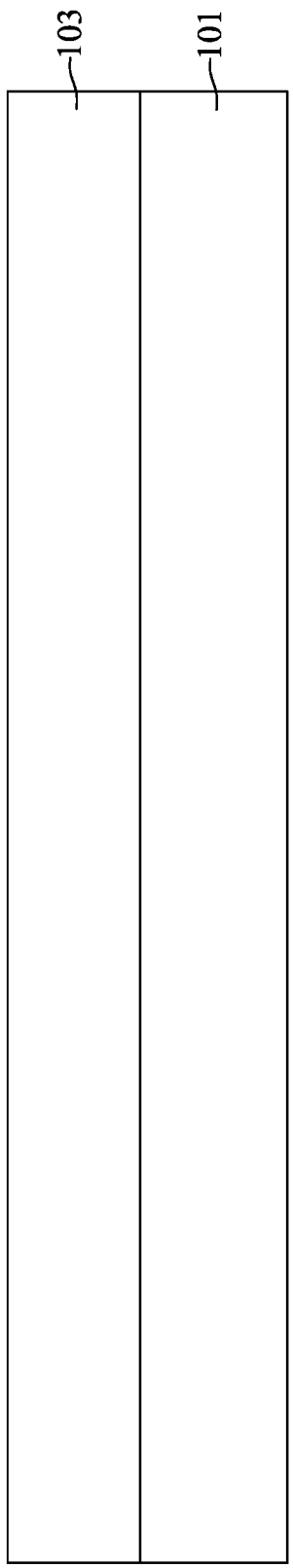
FIG. 4 is a cross-sectional view illustrating an intermediate stage of forming a dielectric layer over a first semiconductor substrate during the formation of a first semiconductor die, in accordance with some embodiments.

As shown in FIG. 4, the first semiconductor substrate 101 is provided. The first semiconductor substrate 101 may be a portion of an integrated circuit (IC) chip that includes various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof.

Depending on the IC fabrication stage, the first semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The first semiconductor substrate 101 has been simplified for the sake of clarity. It should be noted that additional features can be added in the first semiconductor substrate 101, and some of the features described below can be replaced, modified, or eliminated in other embodiments.

Still referring to FIG. 4, the dielectric layer 103 is formed over the first semiconductor substrate 101, in accordance with some embodiments. In some embodiments, the dielectric layer 103 is made of silicon oxide, silicon nitride, silicon oxynitride, or another applicable dielectric material. In addition, the dielectric layer 103 may be formed by a chemical vapor deposition (CVD) process, a physical vapor deposition (PVD) process, an atomic layer deposition (ALD) process, a spin-on coating process, or another applicable process.

Figure 5:
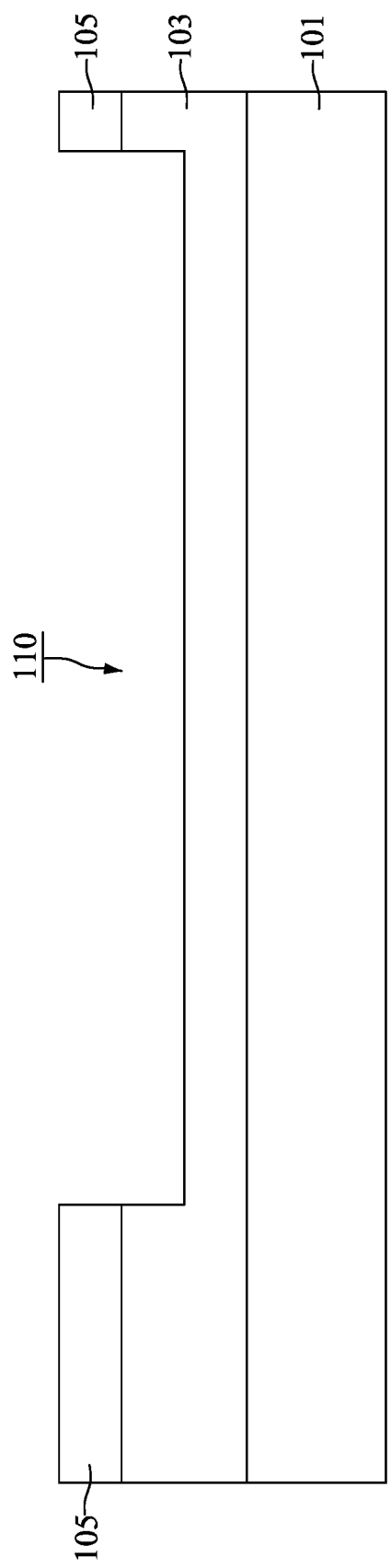
FIG. 5 is a cross-sectional view illustrating an intermediate stage of etching the dielectric layer during the formation of the first semiconductor die, in accordance with some embodiments.

Next, a patterned mask 105 is formed over the dielectric layer 103, as shown in FIG. 5 in accordance with some embodiments. In some embodiments, the dielectric layer 103 is etched by using the patterned mask 105 as a mask, such that an opening 110 is formed in the dielectric layer 103. The opening 110 may be formed by a wet etching process, a dry etching process, or a combination thereof. Although the patterned mask 105 remains over the dielectric layer 103 after the opening 110 is formed in the present embodiment, the patterned mask 105 may be removed after the opening 110 is formed.

Figure 6:
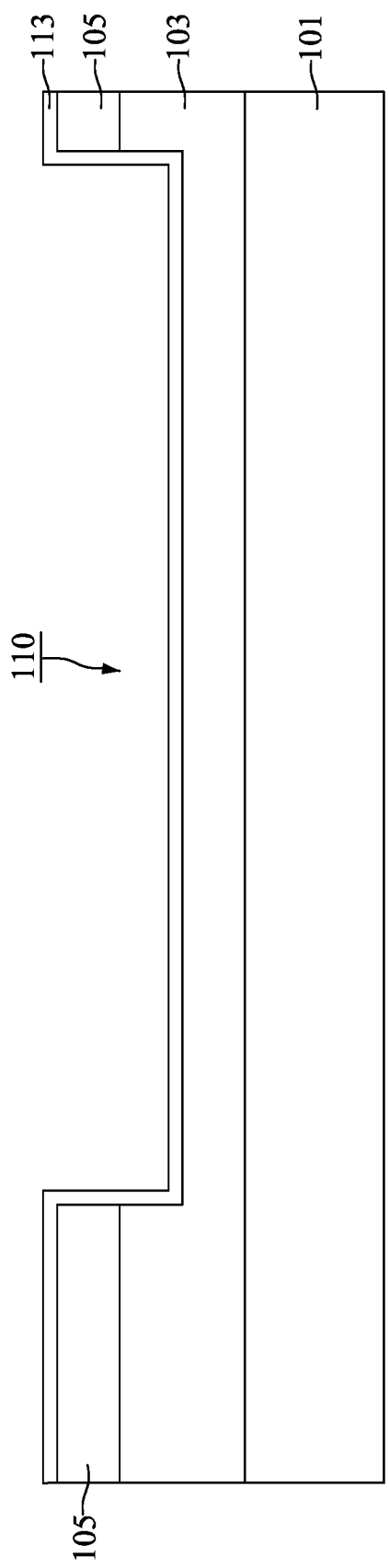
FIG. 6 is a cross-sectional view illustrating an intermediate stage of forming a barrier material during the formation of the first semiconductor die, in accordance with some embodiments.

Then, a barrier material 113 is formed to conformally cover the sidewalls and the bottom surface of the opening 110, and the top surface and the sidewalls of the patterned mask 105 (If the patterned mask 105 is removed after the opening 110 is formed, the barrier material 113 may be formed to cover the top surface of the dielectric layer 103), as shown in FIG. 6 in accordance with some embodiments. In some embodiments, the barrier material 113 is made of titanium (Ti), titanium nitride (TiN), tantalum (Ta), tantalum nitride (TaN), cobalt tungsten (CoW), another applicable material, or a combination thereof. Moreover, the barrier material 113 may be formed by a CVD process, a PVD process, an ALD process, a metal organic chemical vapor deposition (MOCVD) process, a sputtering process, a plating process, or another applicable process.

Figure 7:
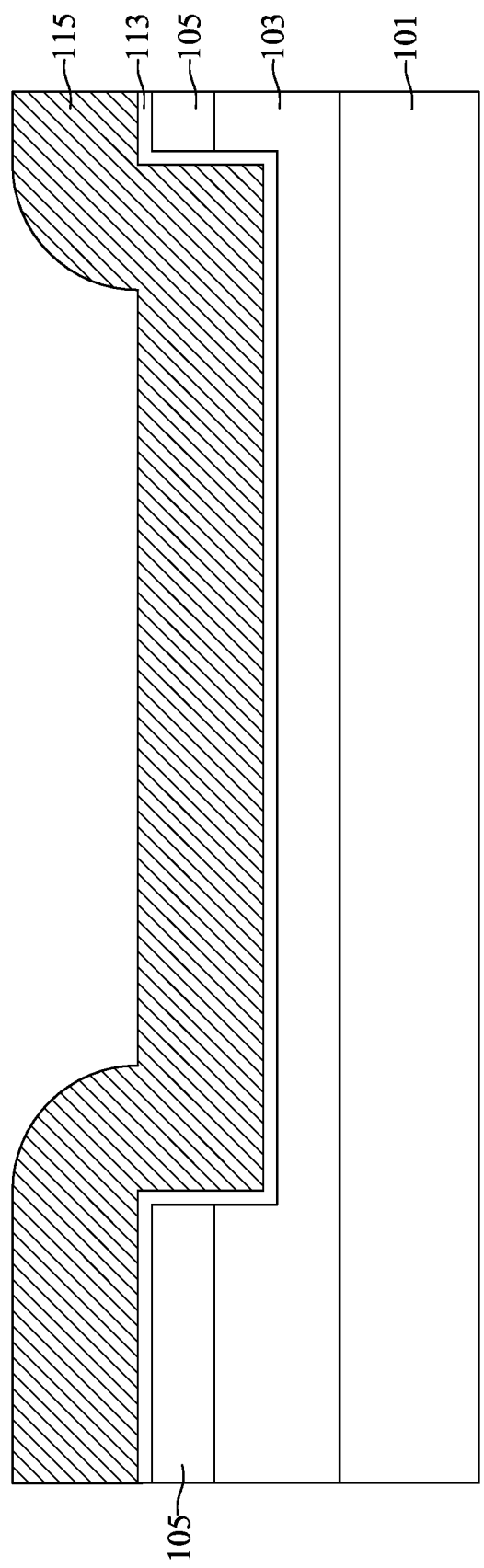
FIG. 7 is a cross-sectional view illustrating an intermediate stage of forming a first metal material during the formation of the first semiconductor die, in accordance with some embodiments.

After the barrier material 113 is formed, a first metal material 115 is conformally formed over the barrier material 113, and the remaining portion of the opening 110 is filled by the first metal material 115, as shown in FIG. 7 in accordance with some embodiments. In some embodiments, the first metal material 115 is made of tungsten (W), aluminum (Al), copper (Cu), titanium (Ti), tantalum (Ta), a combination thereof, or another applicable metal material. Moreover, the first metal material 115 may be formed by a CVD process, a PVD process, an ALD process, an MOCVD process, a sputtering process, a plating process, or another applicable process.

Figure 8:
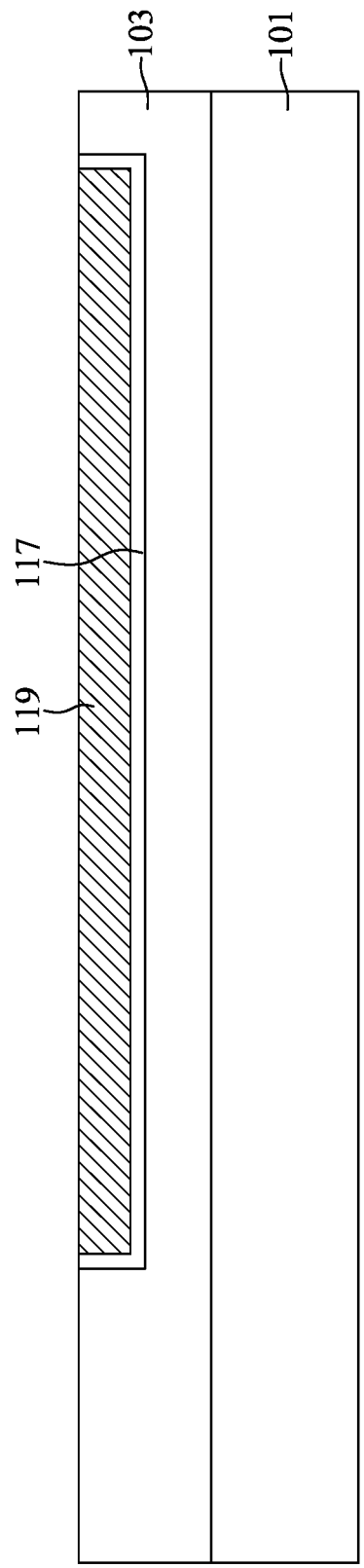
FIG. 8 is a cross-sectional view illustrating an intermediate stage of planarizing the first metal material to form a first metal layer during the formation of the first semiconductor die, in accordance with some embodiments.

Subsequently, a planarization process is performed on the first metal material 115 and the barrier material 113 to form the first metal layer 119 and the barrier layer 117 in the opening 110 (See FIG. 5), as shown in FIG. 8 in accordance with some embodiments. The planarization process may include a chemical mechanical planarization (CMP) process, which removes the patterned mask 105 and the excess portions of the barrier material 113 and the first metal material 115 over the dielectric layer 103.

In some embodiments, the barrier layer 117 covers the sidewalls and the bottom surface of the first metal layer 119. In some embodiments, the top surface of the first metal layer 119, the top surface of the barrier layer 117 and the top surface of the dielectric layer 103 are substantially coplanar with each other. Within the context of this disclosure, the word "substantially" preferably means at least 90%, more preferably 95%, even more preferably 98%, and most preferably 99%.

Figure 9:
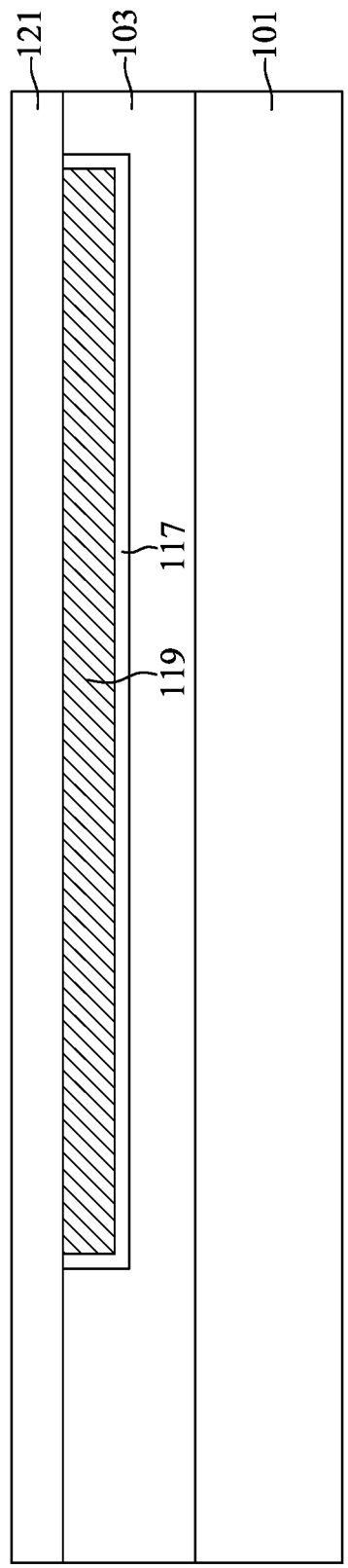
FIG. 9 is a cross-sectional view illustrating an intermediate stage of forming a dielectric layer to cover the first metal layer during the formation of the first semiconductor die, in accordance with some embodiments.

Next, the dielectric layer 121 is formed over the dielectric layer 103, as shown in FIG. 9 in accordance with some embodiments. In some embodiments, the barrier layer 117 and the first metal layer 119 are covered by the dielectric layer 121. Some materials and processes used to form the dielectric layer 121 are similar to, or the same as those used to form the dielectric layer 103, and details thereof are not repeated herein.

Figure 10:
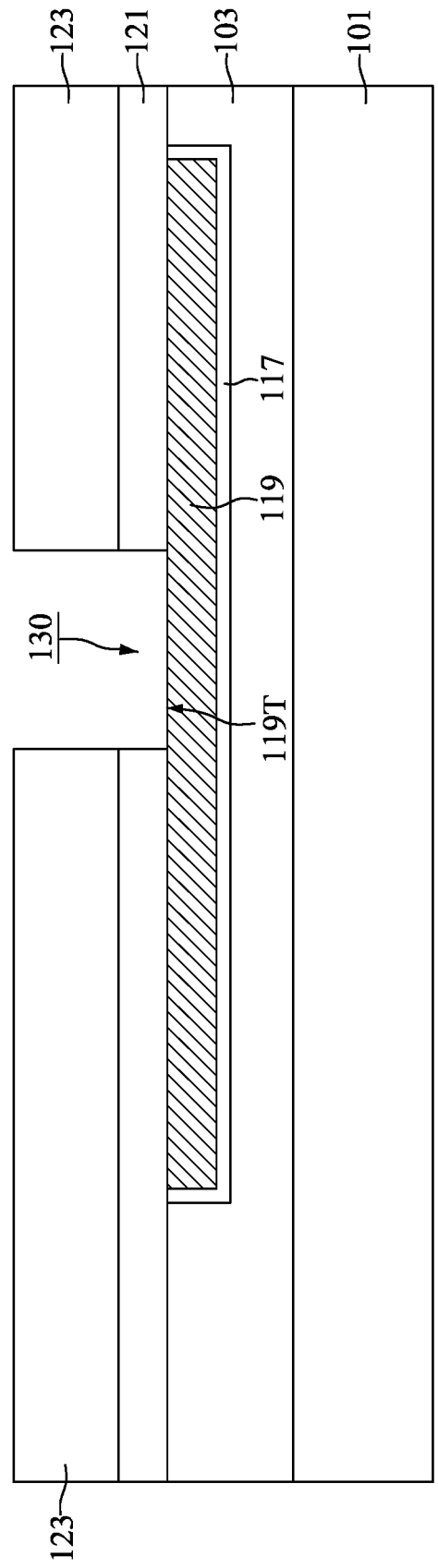
FIG. 10 is a cross-sectional view illustrating an intermediate stage of etching the dielectric layer to partially expose the first metal layer during the formation of the first semiconductor die, in accordance with some embodiments.

Then, a patterned mask 123 is formed over the dielectric layer 121, as shown in FIG. 10 in accordance with some embodiments. In some embodiments, the dielectric layer 121 is etched by using the patterned mask 123 as a mask, such that an opening 130 is formed penetrating through the dielectric layer 121. In other words, a portion of the top surface 119T of the first metal layer 119 is exposed by the opening 130. The opening 130 may be formed by a wet etching process, a dry etching process, or a combination thereof. The patterned mask 123 may be removed after the opening 130 is formed.

Figure 11:
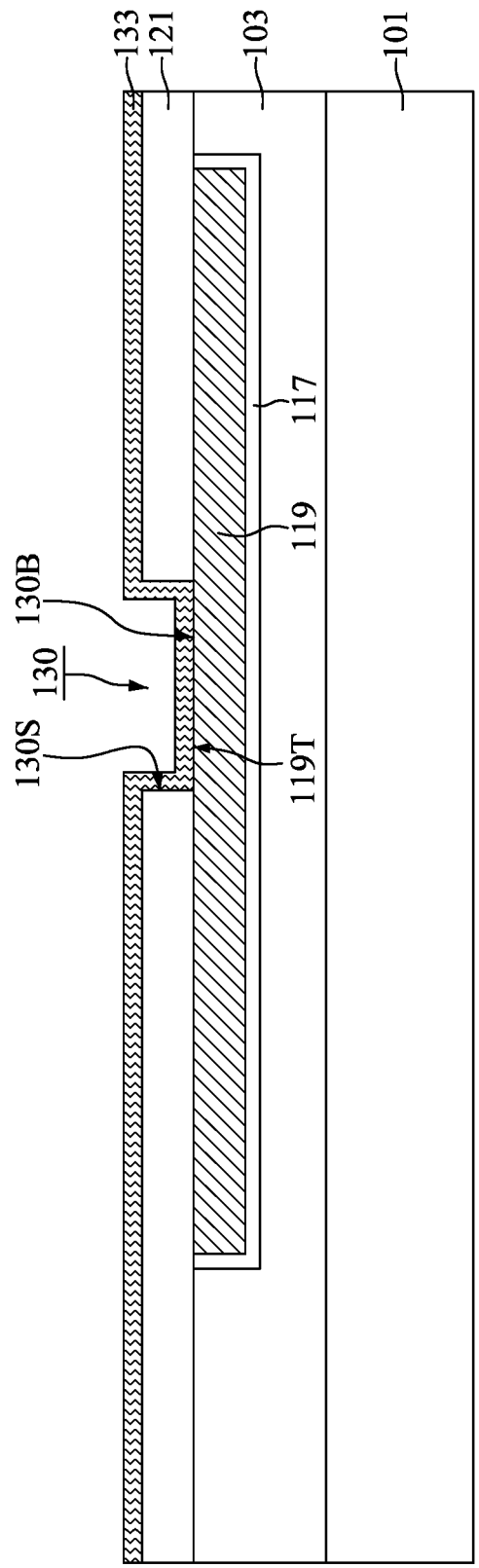
FIG. 11 is a cross-sectional view illustrating an intermediate stage of forming a first conductive polymer material during the formation of the first semiconductor die, in accordance with some embodiments.

After the opening 130 is formed, a first conductive polymer material 133 is formed to cover the sidewalls 130S and the bottom surface 130B of the opening 130 and the top surface of the dielectric layer 121, as shown in FIG. 11 in accordance with some embodiments. In some embodiments, the portion of the top surface 119T of the first metal layer 119 exposed by the opening 130 is covered by the first conductive polymer material 133.

In some embodiments, the first conductive polymer material 133 includes graphene or conjugated polymer, such as poly(3,4-ethylenedioxythiophene) (PEDOT), or polyaniline (PANI). In some embodiments, the first conductive polymer material 133 is formed by a CVD process, a PVD process, an ALD process, a spin-on coating process, or another applicable process.

Figure 12:
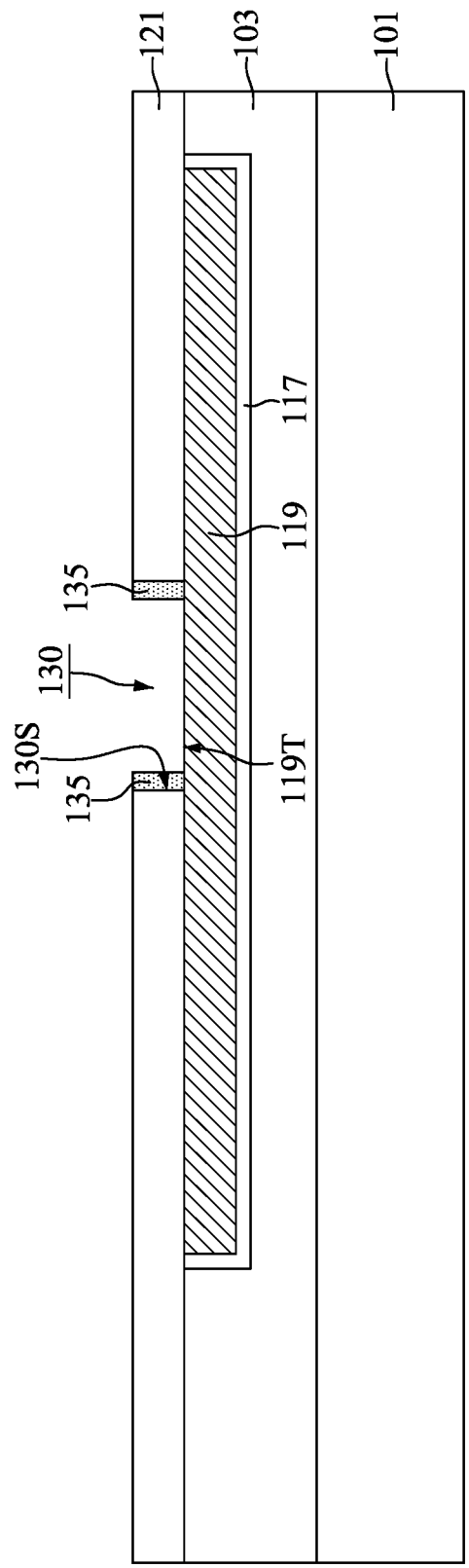
FIG. 12 is a cross-sectional view illustrating an intermediate stage of partially etching the first conductive polymer material to form a first conductive polymer liner during the formation of the first semiconductor die, in accordance with some embodiments.

Next, an anisotropic etching process is performed on the first conductive polymer material 133 to remove the same amount of the first conductive polymer material 133 vertically in all places, leaving the first conductive polymer liner 135 on the sidewalls 130S of the opening 130, as shown in FIG. 12 in accordance with some embodiments. In some embodiments, the etching process is a dry etching process. After the etching process, the top surface of the dielectric layer 121 is exposed, and the top surface 119T of the first metal layer 119 is partially exposed, in accordance with some embodiments.

Figure 13:
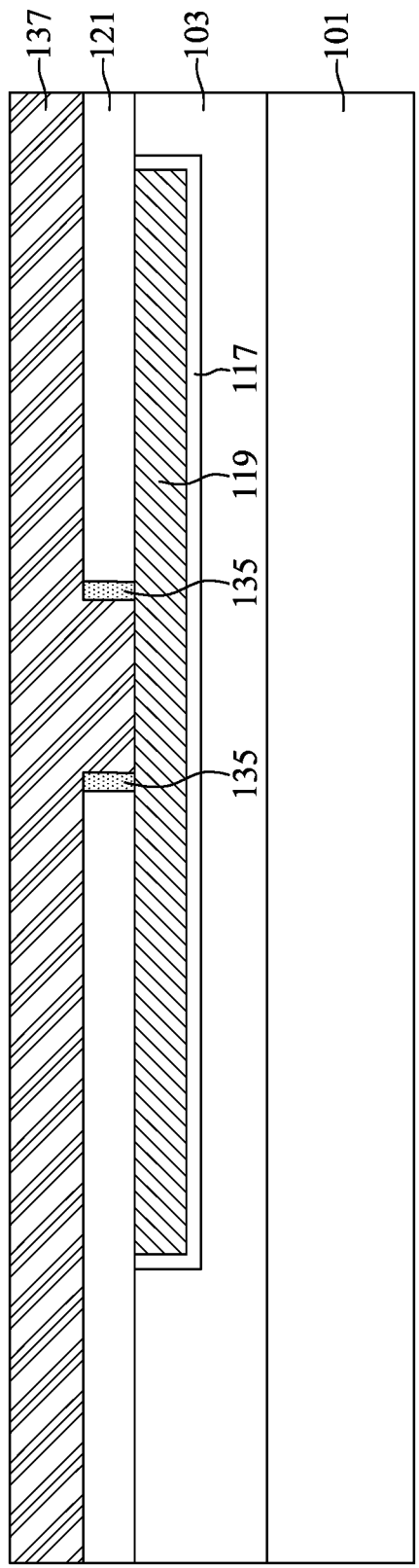
FIG. 13 is a cross-sectional view illustrating an intermediate stage of forming a first conductive material during the formation of the first semiconductor die, in accordance with some embodiments.

After the first conductive polymer liner 135 is formed, a first conductive material 137 is formed over the dielectric layer 121, and the remaining portion of the opening 130 is filled by the first conductive material 137, as shown in FIG. 13 in accordance with some embodiments. Some materials and processes used to form the first conductive material 137 are similar to, or the same as those used to form the first metal material 115, and details thereof are not repeated herein. In some embodiments, the first conductive polymer liner 135 is covered by the first conductive material 137.

Figure 14:
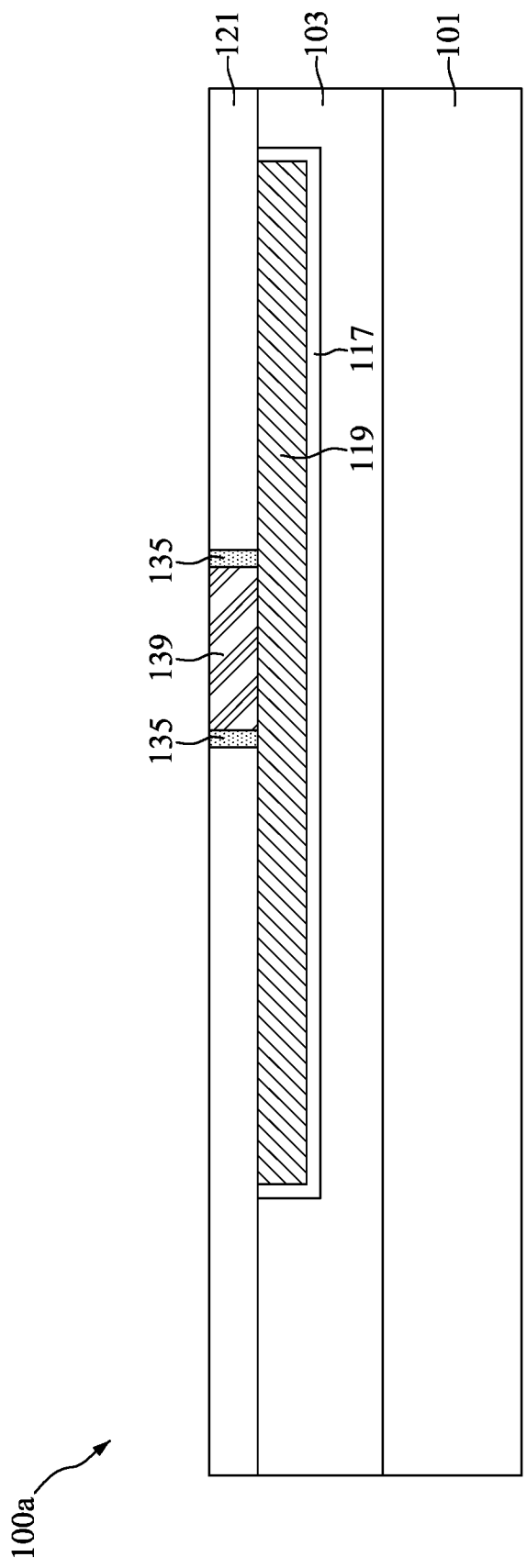
FIG. 14 is a cross-sectional view illustrating an intermediate stage of planarizing the first conductive material to form a first conductive via during the formation of the first semiconductor die, in accordance with some embodiments.

Then, a planarization process is performed on the first conductive material 137 to form the first conductive via 139 in the opening 130 (See FIG. 12), as shown in FIG. 14 in accordance with some embodiments. The planarization process may include a CMP process, which removes excess portion of the first conductive material 137 over the dielectric layer 121. After the planarization process, the top surface of the first conductive via 139, the top surface of the first conductive polymer liner 135 and the top surface of the dielectric layer 121 are coplanar with each other, and the first semiconductor die 100a is obtained. In some embodiments, the first conductive via 139 and the first conductive polymer liner 135 are disposed over and in direct contact with the first metal layer 119, and the first conductive via 139 is surrounded by the first conductive polymer liner 135.

Figure 15:
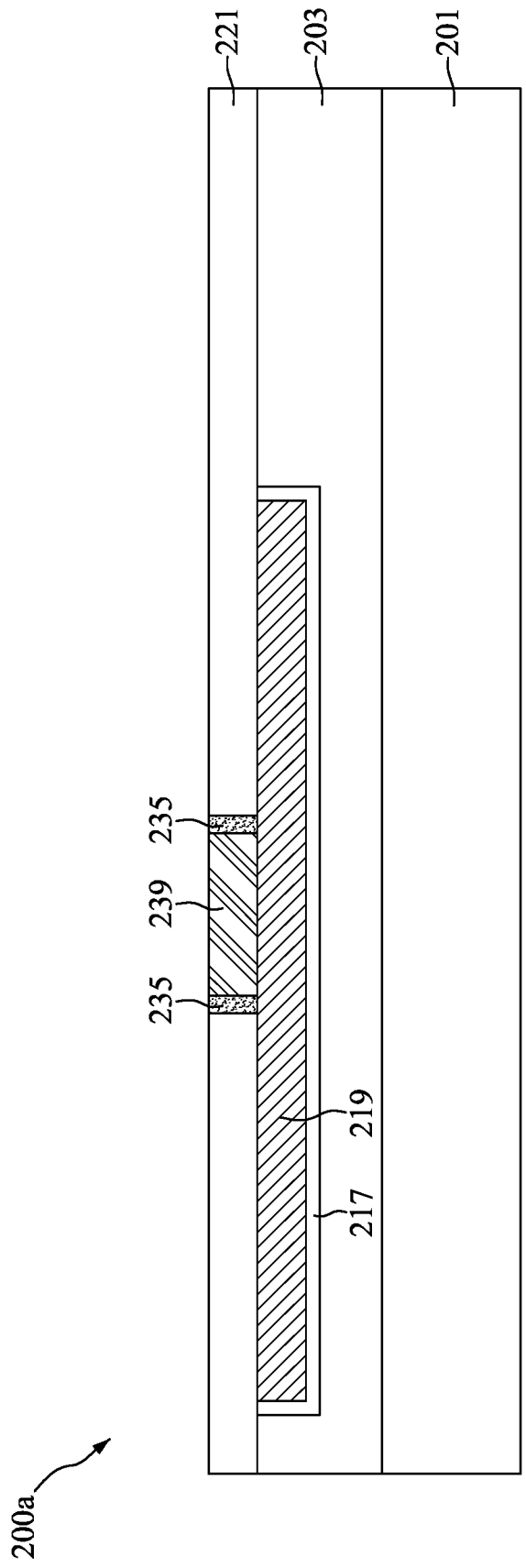
FIG. 15 is a cross-sectional view illustrating a second semiconductor die, in accordance with some embodiments.

FIG. 15 is a cross-sectional view illustrating an intermediate stage of forming the semiconductor device structure 300a, in accordance with some embodiments. Specifically, FIG. 15 shows a cross-sectional view of the second semiconductor die 200a, in accordance with some embodiments. The respective step is illustrated as the step S13 in the method 10 shown in FIG. 3.

Some materials and processes used to form the second semiconductor die 201, the dielectric layer 203, the barrier layer 217, the second metal layer 219, the dielectric layer 221, the second conductive polymer liner 235 and the second conductive via 239 are similar to, or the same as those used to form the first semiconductor die 101, the dielectric layer 103, the barrier layer 117, the first metal layer 119, the dielectric layer 121, the first conductive polymer liner 135 and the first conductive via 139, respectively, and details thereof are not repeated herein. After the second conductive via 239 is formed, the second semiconductor die 200a is obtained. In some embodiments, the second conductive via 239 and the second conductive polymer liner 235 are disposed over and in direct contact with the second metal layer 219, and the second conductive via 239 is surrounded by the second conductive polymer liner 235.

Next, the second semiconductor die 200a is flipped upside down and bonded on the first semiconductor die 100a with the dielectric layer 221 facing the dielectric layer 121, as shown in FIG. 1 in accordance with some embodiments. The respective step is illustrated as the step S15 in the method 10 shown in FIG. 3. After the bonding process, the semiconductor device structure 300a is obtained.

In some embodiments, the second conductive via 239 is bonded on the first conductive via 139, and the second conductive polymer liner 235 is bonded on the first conductive polymer liner 135. In some embodiments, the first conductive via 139, the second conductive via 239, the first conductive polymer liner 135 and the second conductive polymer liner 235 form the conductive structure 339 electrically connecting the first metal layer 119 of the first semiconductor die 100a and the second metal layer 219 of the second semiconductor die 200a. In some embodiments, the electrical element (not shown) in the first semiconductor substrate 101 is electrically connected to the electrical element (not shown) in the second semiconductor substrate 201 through the first metal layer 119, the conductive structure 339, and the second metal layer 219.

Figure 16:
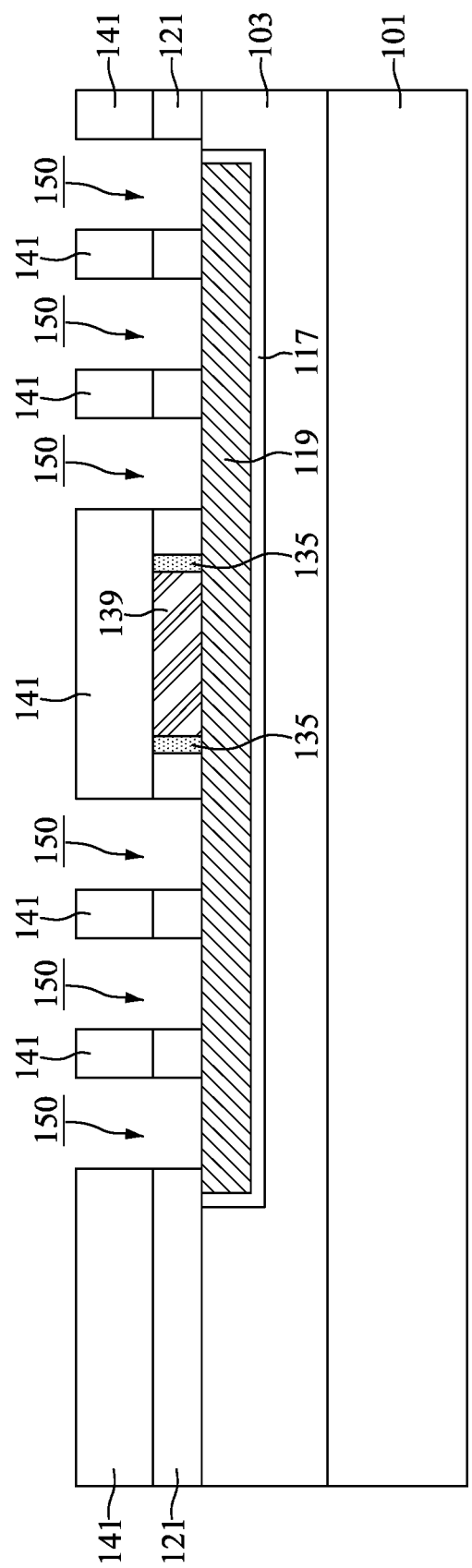
FIG. 16 is a cross-sectional view illustrating an intermediate stage of etching the dielectric layer to form an opening exposing the first metal layer during the formation of a modified first semiconductor die, in accordance with some embodiments.
Figure 17:
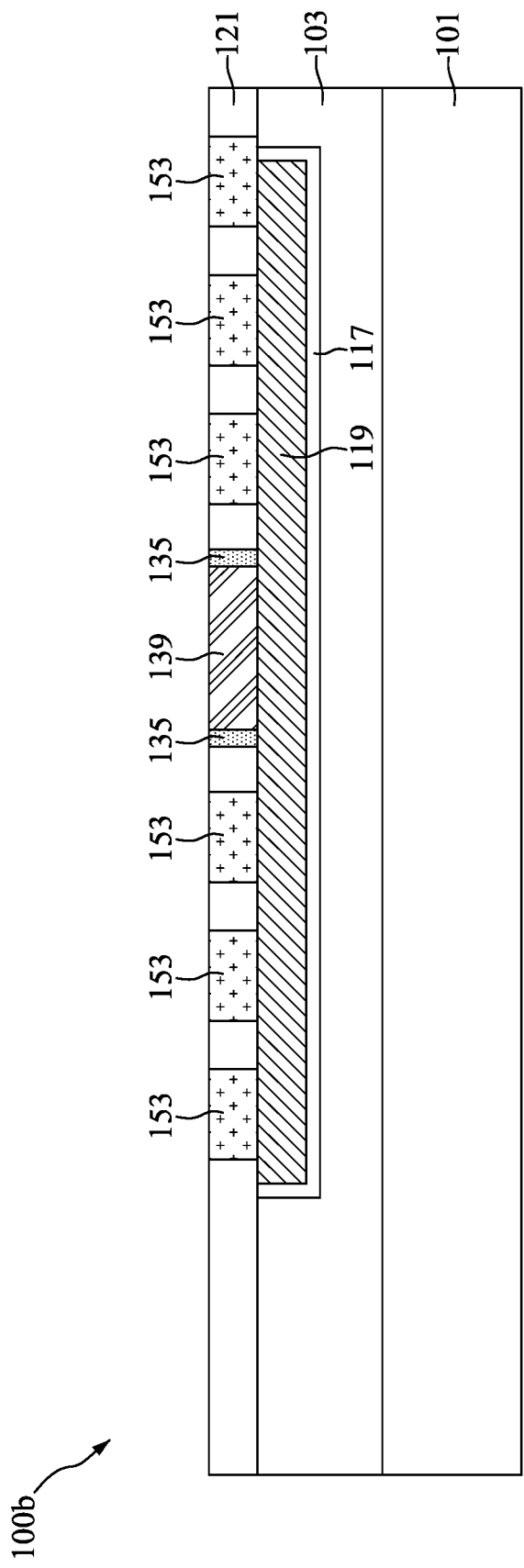
FIG. 17 is a cross-sectional view illustrating an intermediate stage of filling the opening with a first energy removable material during the formation of the modified first semiconductor die, in accordance with some embodiments.

FIGS. 16 to 17 are cross-sectional views illustrating intermediate stages of forming the modified semiconductor device structure 300b, in accordance with some embodiments. Specifically, FIGS. 16 to 17 show cross-sectional views of a sequential process flow of preparing the modified first semiconductor die 100b, in accordance with some embodiments.

After the first conductive via 139 is formed (i.e., following the step of FIG. 14), a patterned mask 141 is formed over the dielectric layer 121, as shown in FIG. 16 in accordance with some embodiments. In some embodiments, the dielectric layer 121 is etched by using the patterned mask 141 as a mask, such that an opening structure 150 is formed in the dielectric layer 121. Although six portions of the opening structure 150 are shown in the cross-sectional view of FIG. 16, the six portions of the opening structure 150 may be connected to each other in different cross-sectional views. The opening structure 150 may be formed by a wet etching process, a dry etching process, or a combination thereof. The patterned mask 141 may be removed after the opening structure 150 is formed.

Next, a first energy removable material 153 is formed in the opening structure 150, as shown in FIG. 17 in accordance with some embodiments. In some embodiments, the first energy removable material 153 is formed over the first metal layer 119 and the dielectric layer 103. In some embodiments, the first energy removable material 153 includes a thermal decomposable material. In some other embodiments, the first energy removable material 153 includes a photonic decomposable material, an e-beam decomposable material, or another applicable energy decomposable material.

Specifically, in some embodiments, the first energy removable material 153 includes a base material and a decomposable porogen material that is substantially removed once being exposed to an energy source (e.g., heat). In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can provide porosity to the space originally occupied by the first energy removable material 153 in the subsequent processes.

The first energy removable material 153 may be formed by a deposition process and a planarization process. The deposition process may include a CVD process, a PVD process, an ALD process, a spin-coating process, or another applicable process. The planarization process may be a CMP process. After the opening structure 150 is filled by the first energy removable material 153, the modified first semiconductor die 100b is obtained.

Figure 18:
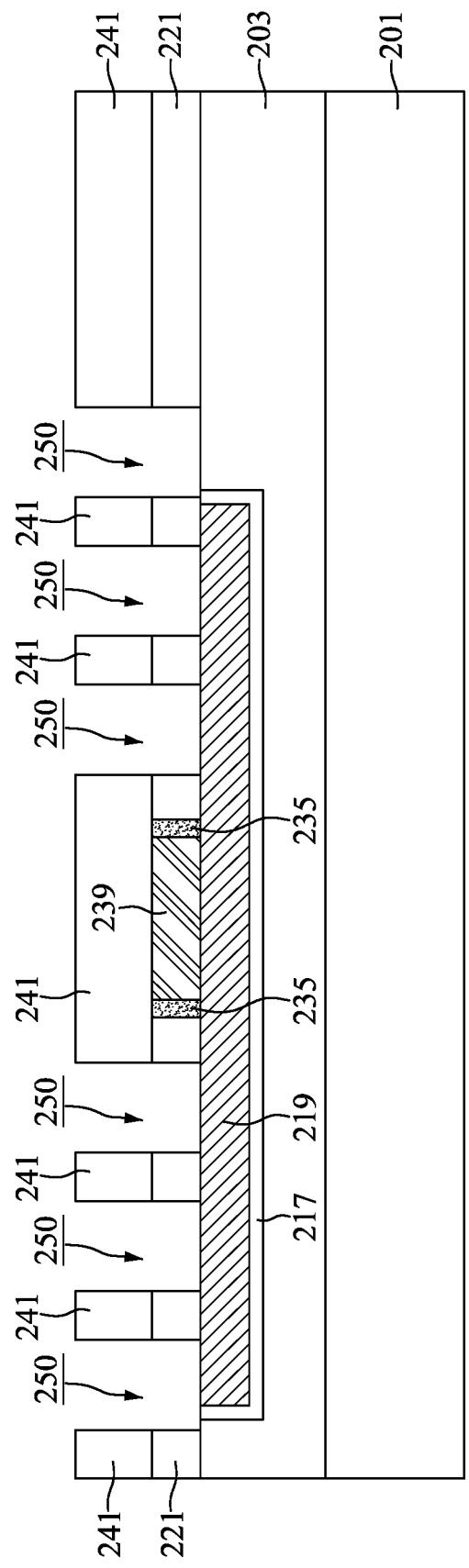
FIG. 18 is a cross-sectional view illustrating an intermediate stage of etching the dielectric layer to form an opening exposing the second metal layer during the formation of a modified second semiconductor die, in accordance with some embodiments.
Figure 19:
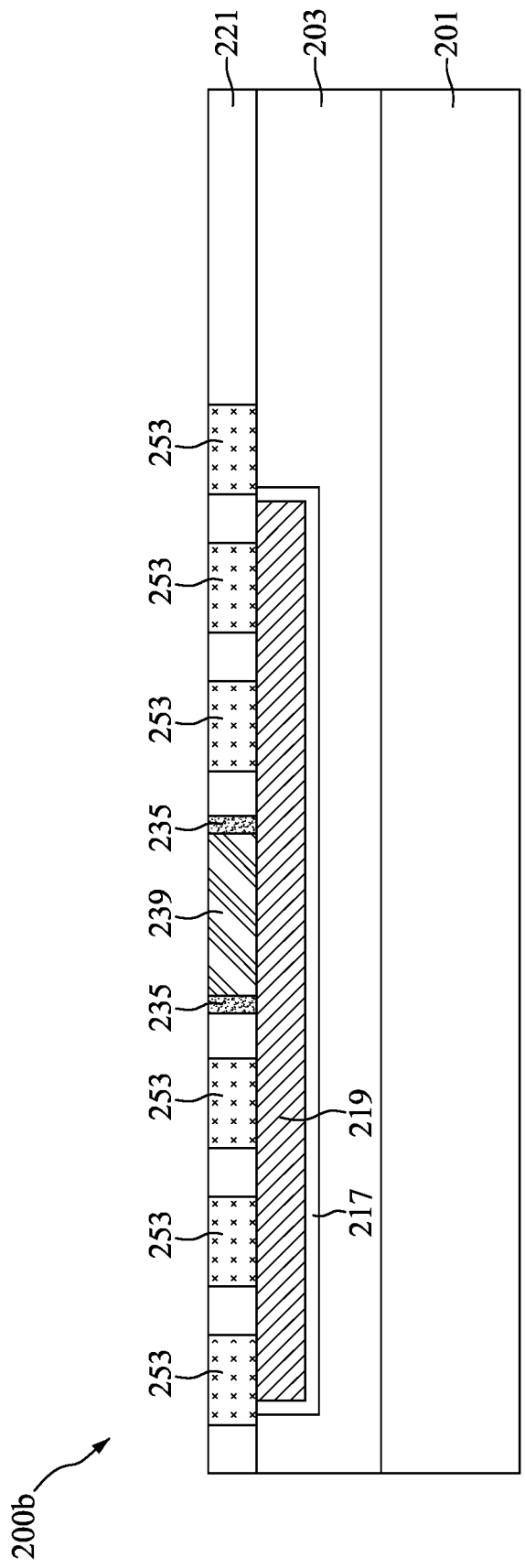
FIG. 19 is a cross-sectional view illustrating an intermediate stage of filling the opening with a second energy removable material during the formation of the modified second semiconductor die, in accordance with some embodiments.
Figure 20:
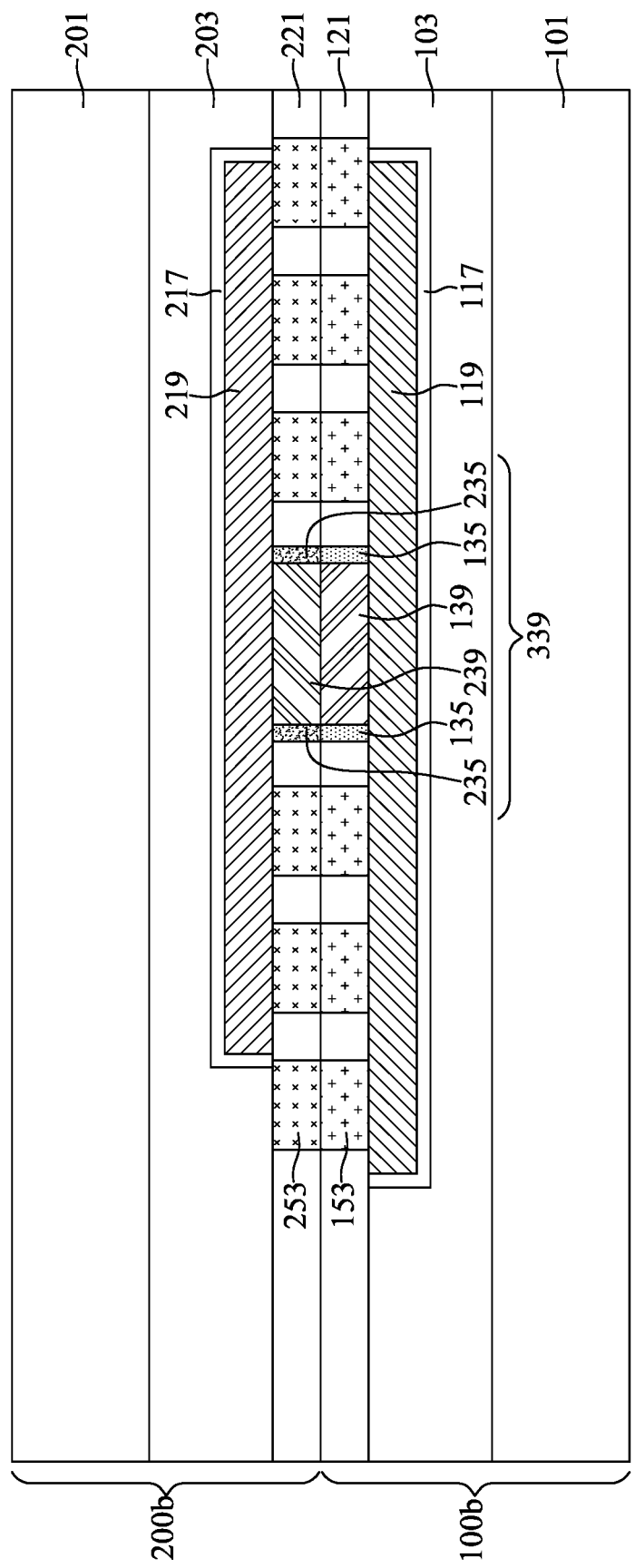
FIG. 20 is a cross-sectional view illustrating an intermediate stage of bonding the modified second semiconductor die to the modified first semiconductor die, in accordance with some embodiments.

FIGS. 18 to 20 are cross-sectional views illustrating intermediate stages of forming the modified semiconductor device structure 300b, in accordance with some embodiments. Specifically, FIGS. 18 to 20 show cross-sectional views of a sequential process flow of preparing the modified second semiconductor die 200b, in accordance with some embodiments.

After the second conductive via 239 is formed (i.e., following the step of FIG. 15), a patterned mask 241 is formed over the dielectric layer 221, as shown in FIG. 18 in accordance with some embodiments. In some embodiments, the dielectric layer 221 is etched by using the patterned mask 241 as a mask, such that an opening structure 250 is formed in the dielectric layer 221. Although six portions of the opening structure 250 are shown in the cross-sectional view of FIG. 18, the six portions of the opening structure 250 may be connected to each other in different cross-sectional views. The opening structure 250 may be formed by a wet etching process, a dry etching process, or a combination thereof. The patterned mask 241 may be removed after the opening structure 250 is formed.

Next, a second energy removable material 253 is formed in the opening structure 250, as shown in FIG. 19 in accordance with some embodiments. In some embodiments, the second energy removable material 253 is formed over the second metal layer 219 and the dielectric layer 203. Some materials and processes used to form the second energy removable material 253 are similar to, or the same as those used to form the first energy removable material 153, and details thereof are not repeated herein. After the opening structure 250 is filled by the second energy removable material 253, the modified second semiconductor die 200b is obtained.

Then, the modified second semiconductor die 200b is flipped upside down and bonded on the modified first semiconductor die 100b with the dielectric layer 221 facing the dielectric layer 121, as shown in FIG. 20 in accordance with some embodiments. In some embodiments, the second energy removable material 253 is bonded on the first energy removable material 153. Similar to the semiconductor device structure 300a, the first conductive via 139, the second conductive via 239, the first conductive polymer liner 135 and the second conductive polymer liner 235 form the conductive structure 339 electrically connecting the first metal layer 119 of the modified first semiconductor die 100b and the second metal layer 219 of the modified second semiconductor die 200b.

Subsequently, a heat treatment process is performed on the structure of FIG. 20 to transform the bonded first energy removable material 153 and the second energy removable material 253 into the energy removable structure 353 and the air gap structure G, as shown in FIG. 2 in accordance with some embodiments. The respective step is illustrated as the step S17 in the method 10 shown in FIG. 3. In some embodiments, the air gap structure G is enclosed by the energy removable structure 353.

More specifically, in some embodiments, the heat treatment process is used to remove the decomposable porogen materials of the first energy removable material 153 and the second energy removable material 253 to generate pores, and the base materials of the first energy removable material 153 and the second energy removable material 253 are accumulated at the edges of the space occupied by the first energy removable material 153 and the second energy removable material 253. The pores are filled by air after the decomposable porogen materials are removed, such that the air gap structure G is obtained inside the remaining portions of the first energy removable material 153 and the second energy removable material 253 (i.e., the energy removable structure 353), in accordance with some embodiments.

In some embodiments, the energy removable structure 353 and the air gap structure G is formed between the first metal layer 119 of the modified first semiconductor die 100b and the second metal layer 219 of the modified second semiconductor die 200b. In some embodiments, the air gap structure G is separated from the first metal layer 119 and the second metal layer 219 by the energy removable structure 353. In some embodiments, the energy removable structure 353 is in direct contact with the first metal layer 119 and the second metal layer 219. After the heat treatment process, the modified semiconductor device structure 300b is obtained.

Embodiments of the semiconductor device structures 300a and 300b are provided in the disclosure. To lower the resistance, the semiconductor device structures 300a and 300b include the conductive polymer liners 135 and 235 surrounding the conductive vias 139 and 239, respectively. Since the conductive polymer liners 135 and 235 include low-resistance conductive materials, such as graphene or conjugated polymer (e.g., PEDOT, PANI, etc.), resistive-capacitive (RC) delay can be reduced. Therefore, the operation speeds of the semiconductor device structures 300a and 300b may be increased, which significantly improves the overall device performance.

In one embodiment of the present disclosure, a semiconductor device structure is provided. The semiconductor device structure includes a first metal layer disposed over a semiconductor substrate, and a second metal layer disposed over the first metal layer. The semiconductor device structure also includes a conductive structure disposed between the first metal layer and the second metal layer. The conductive structure includes a first conductive via and a first conductive polymer liner surrounding the first conductive via.

In another embodiment of the present disclosure, a semiconductor device structure is provided. The semiconductor device structure includes a first metal layer disposed over a semiconductor substrate, and a conductive structure disposed over the first metal layer. The conductive structure includes a first conductive via, a second conductive via disposed over the first conductive via, a first conductive polymer liner disposed on sidewalls of the first conductive via, and a second conductive polymer liner disposed on sidewalls of the second conductive via. The first conductive polymer liner and the second conductive polymer liner include graphene or conjugated polymer. The semiconductor device structure also includes a second metal layer disposed over the conductive structure.

In yet another embodiment of the present disclosure, a method for forming a semiconductor device structure is provided. The method includes forming a first semiconductor die and forming a second semiconductor die. The first semiconductor die includes a first metal layer, a first conductive via over the first metal layer, and a first conductive polymer liner surrounding the first conductive via. The second semiconductor die includes a second metal layer, a second conductive via over the second metal layer, and a second conductive polymer liner surrounding the second conductive via. The method also includes forming a conductive structure electrically connecting the first metal layer and the second metal layer by bonding the second semiconductor die to the first semiconductor die. The conductive structure is formed by the first conductive via, the first conductive polymer liner, the second conductive via, and the second conductive polymer liner. The first conductive via is bonded with the second conductive via, and the first conductive polymer liner is bonded with the second conductive polymer liner.

The embodiments of the present disclosure have some advantageous features. By forming a conductive polymer liner surrounding a conductive via, the resistance may be decreased. As a result, the operation speed of the semiconductor device structure is increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for forming a semiconductor device structure, comprising:
    forming a first semiconductor die, wherein the first semiconductor die comprises a first metal layer, a first conductive via over the first metal layer, and a first conductive polymer liner surrounding the first conductive via;
    forming a second semiconductor die, wherein the second semiconductor die comprises a second metal layer, a second conductive via over the second metal layer, and a second conductive polymer liner surrounding the second conductive via; and
    forming a conductive structure electrically connecting the first metal layer and the second metal layer by bonding the second semiconductor die to the first semiconductor die, wherein the conductive structure is formed by the first conductive via, the first conductive polymer liner, the second conductive via, and the second conductive polymer liner, the first conductive via is bonded with the second conductive via, and the first conductive polymer liner is bonded with the second conductive polymer liner;
    wherein the forming of the first semiconductor die comprises:
    forming the first metal layer over a first semiconductor substrate;
    forming a first dielectric layer covering the first metal layer;
    etching the first dielectric layer to form a first opening exposing a portion of the first metal layer; and
    forming the first conductive via and the first conductive polymer liner in the first opening to contact the portion of the first metal layer.

2. The method for forming a semiconductor device structure of claim 1, wherein the forming of the first conductive polymer liner comprises:
    depositing a first conductive polymer material over a bottom surface and sidewalls of the first opening; and
    removing a portion of the first conductive polymer material over the bottom surface of the first opening, wherein a remaining portion of the first conductive polymer material forms the first conductive polymer liner.

3. The method for forming a semiconductor device structure of claim 2, wherein the first conductive polymer material comprises graphene, poly(3,4-ethylenedioxythiophene) (PEDOT), or polyaniline (PANI).

4. The method for forming a semiconductor device structure of claim 1, wherein the forming of the first semiconductor die further comprises:
    etching the first dielectric layer to form a second opening exposing another portion of the first metal layer after the first conductive via is formed; and
    filling the second opening with a first energy removable material.

5. The method for forming a semiconductor device structure of claim 4, wherein the second semiconductor die further comprises a second energy removable material, and the second energy removable material is bonded with the first energy removable material after the second semiconductor die is bonded to the first semiconductor die.

6. The method for forming a semiconductor device structure of claim 5, further comprising:

performing a heat treatment process to transform the first energy removable material and the second energy removable material into an energy removable structure after the conductive structure is formed, wherein an air gap structure is enclosed by the energy removable structure, and the conductive structure is surrounded by the air gap structure.

* * * * *